(12) United States Patent
Le Guillou

(10) Patent No.: US 7,944,385 B2
(45) Date of Patent: May 17, 2011

(54) CONTINUOUS-TIME SIGMA-DELTA ANALOG-TO-DIGITAL CONVERTER WITH CAPACITOR AND/OR RESISTANCE DIGITAL SELF-CALIBRATION MEANS FOR RC SPREAD COMPENSATION

(75) Inventor: Yann Le Guillou, Caen (FR)

(73) Assignee: NXP B.V., Eindhoven (NL)

( * ) Notice: Subject to any disclaimer, the term of this patent is extended or adjusted under 35 U.S.C. 154(b) by 376 days.

(21) Appl. No.: 12/161,532

(22) PCT Filed: Jan. 22, 2007

(86) PCT No.: PCT/IB2007/050213
§ 371 (c)(1),
(2), (4) Date: Jul. 18, 2008

(87) PCT Pub. No.: WO2007/085997
PCT Pub. Date: Aug. 2, 2007

(65) Prior Publication Data
US 2010/0219997 A1    Sep. 2, 2010

(30) Foreign Application Priority Data

Jan. 25, 2006 (EP) .................................. 06300070

(51) Int. Cl.
*H03M 3/00* (2006.01)
(52) U.S. Cl. .................. 341/143; 341/155; 341/156
(58) Field of Classification Search .......... 341/143, 341/155, 156
See application file for complete search history.

(56) References Cited

U.S. PATENT DOCUMENTS

| | | | | |
|---|---|---|---|---|
| 5,574,678 A | * | 11/1996 | Gorecki | 708/801 |
| 5,625,316 A | * | 4/1997 | Chambers et al. | 327/553 |
| 5,914,633 A | * | 6/1999 | Comino et al. | 327/553 |
| 6,069,505 A | * | 5/2000 | Babanezhad | 327/156 |
| 6,424,209 B1 | * | 7/2002 | Gorecki et al. | 327/554 |
| 6,639,534 B2 | * | 10/2003 | Khoini-Poorfard et al. | 341/144 |
| 6,714,066 B2 | * | 3/2004 | Gorecki et al. | 327/553 |
| 6,940,436 B2 | * | 9/2005 | Hezar et al. | 341/143 |
| 6,954,159 B1 | * | 10/2005 | Cooper et al. | 341/143 |
| 7,034,730 B2 | * | 4/2006 | Siferd et al. | 341/143 |
| 2005/0285763 A1 | | 12/2005 | Nguyen et al. | |

FOREIGN PATENT DOCUMENTS

WO    0103312  A1    1/2001

OTHER PUBLICATIONS

Shim Jae Hoon et al; "A Hybrid Delta-Sigma Modulator with Adaptive Calibration", Circuits and Systems, 2003, IEEE ISCAS '03. Proceedings of the 2003 Symposium on . . . , May 25-28, 2003, IEEE, US. vol. 1, pp. I-1025-I-1028.

Philips K et al; "A 2MW 89 DB Continuous Time ΣΔ ADC with Increased Immunity to Wide-Band Interferers", ISSCC Dig. Tech. Papers, Feb. 2004, IEEE International, vol. 1, pp. 86-87.

* cited by examiner

*Primary Examiner* — Jean B Jeanglaude

(57) ABSTRACT

A continuous-time sigma-delta analog-to-digital converter (CV) including i) a signal path (SP) having at least one combiner (C1) for combining analog signals to convert with feedback analog signals, at least two integrators (H1, H5), mounted in series, to integrate the combined analog signals, a quantizer (Q) for converting the integrated signals into digital signals, and a decimation filter (DF) for filtering digital signals, and ii) a feedback path (FP) having at least a digital-to-analog converter (DAC) for converting the digital signals output by the quantizer (Q) into feedback analog signals intended for the combiner (C1). Each integrator (H1, H5) having variable capacitance means arranged to be set in chosen states defined by the values of a digital word, to present the chosen capacitances

25 Claims, 11 Drawing Sheets

CONTINUOUS-TIME SIGMA-DELTA ANALOG-TO-DIGITAL CONVERTER WITH CAPACITOR AND/OR RESISTANCE DIGITAL SELF-CALIBRATION MEANS FOR RC SPREAD COMPENSATION

FIELD OF THE INVENTION

The present invention relates to the domain of radio signal processing, and more precisely to continuous-time (CT) sigma-delta (ΣΔ) analog-to-digital converters (ADCs) used for converting analog radio signals.

BACKGROUND OF THE INVENTION

As is known to a person skilled in the art, CT ΣΔ ADCs are frequently used in numerous domains and especially in wireless radio receivers (or transceivers) used in radio communication equipment, such as mobile phones, where selected analog radio signals need to be converted into digital signals before being demodulated.

Such converters are notably described in the document by K. Philips et al "A 2 mW 89 dB DR Continuous-Time ΣΔ ADC with Increased Immunity to Wide-Band Interferers", ISSCC Dig. Tech. Papers, pp 86-87, February 2004, and in the patent document WO 01/03312.

These converters offer some meaningful advantages over discrete-time (DT) implementations, and notably an implicit anti-aliasing filter, no front-end sample and hold S/H (there is a S/H but it is located after the loop filter which therefore is not discrete-time but continuous-time and enables to build anti-aliasing property in the ΣΔ ADC loop), the absence of kT/C noise and speed advantages, which all lead to a lower power consumption.

Nevertheless, in baseline deep-submicron CMOS technology (with low voltage supply: for instance 1.2 V in CMOS90LP), the continuous time loop filter of a CT ΣΔ ADC is built with RC integrators which are very sensitive to process variations and temperature spread of their analog components.

In fact the time constant, and hence the unity gain frequency, of these RC integrators depends on their RC product and therefore on the types of their resistances and capacitors (for instance P+ poly or N+ poly resistances and fringe capacitors in case of CMOS technology) which are very sensitive to process variations and temperature spread. In CMOS technology, the process spread increases as the technology is scaling down. For instance, the worst case spread on the RC product is approximately +/−25% in 90 nm-CMOS technology, and approximately +/−40% in 65 nm-CMOS technology.

It can be shown that in the presence of a full-scale input signal, the RC time constant variations modify the CT ΣΔ ADC output spectrum in two different ways. Firstly, when the RC time constants of the integrators are too large, the quantization noise shifts to the bandwidth and reduces the signal-to-noise ratio (SNR) performance. Secondly, when the RC time constants of the integrators are too small, the loop filter becomes unstable because the noise transfer function is too aggressive. In both situations, the in-band noise (IBN) increases and consequently the signal-to-noise ratio decreases.

For instance, a 1-bit, single loop, feedforward CT ΣΔ ADC clocked at 288 MHz with 70 dB SNR in 4 MHz is suitable for highly digitized ZIF DVB H receiver. In this case, the simulated signal-to-quantization noise ratio (SQNR) is equal to 80 dB when the RC time constant is nominal, and if one takes into account the circuit noise (thermal noise, 1/f noise and clock jitter), then the nominal SNR is equal to 72 dB. Therefore, no more than +/−10% spread can be tolerated on the RC time constant. The spread on the RC product being +/−25% in the 90 nm-CMOS technology, this means that the RC time constant needs to be calibrated.

In the document of J. H. Shim et al, "A Hybrid Delta-Sigma Modulator with Adaptative Calibration", in proc. IEEE ISCAS, May 2003, pp. 1025 1028, it has been proposed to use analog and digital integrators and to calibrate the digital integrators to match the analog integrators and then to keep good SNR performance. More precisely, the decimation filter output is monitored and the digital integrators are controlled, so that the SNR of the decimated output be maximized.

To simplify the SNR measurement during calibration, a special input pattern must be used. This input pattern is an impulse train whose fundamental frequency lies out-of-band. Because of this specific input pattern, the decimated output does not contain any signal component, so that the IBN must be estimated by calculating the variance of the output stream (a steepest descent algorithm updates the digital coefficients of the digital integrators to minimize the variance). Unfortunately this steepest descent algorithm has a very slow convergence. Approximately 400 iterations are necessary to converge to the calibration values, which takes too much time (for instance 91 ms for 400 iterations with $2^{16}$ samples at 288 MHz ($400*2^{16}/288.10^6=91$ ms)) and then prohibits calibration before each use of the CT ΣΔ ADC.

SUMMARY OF THE INVENTION

So, the object of this invention is to improve the situation at least partly, and notably to provide a CT ΣΔ ADC with capacitance and/or resistance digital self-calibration means, which neither requires a dedicated test signal nor external calibration equipment.

For this purpose, it provides a continuous-time sigma-delta analog-to-digital converter (CT ΣΔ ADC), for converting analog signals into digital signals, comprising i) a (main) signal path comprising at least one combiner for combining analog signals to be converted with feedback analog signals, at least two integrators mounted in series and adapted to integrate the combined analog signals, a quantizer for converting the integrated signals into digital signals, and a decimation filter for filtering huge out-of band quantization noise and for reducing the bitstream data rate, and ii) a feedback path comprising at least a digital-to-analog converter (DAC) for converting the digital signals output by the quantizer into feedback analog signals intended for the combiner.

This converter (CT ΣΔ ADC) is characterized in that:
at least one of its integrators comprises variable capacitance means and/or variable resistance means arranged to be set in chosen states depending on the values of a digital word in order to present chosen capacitances and/or chosen resistances, and
it also comprises a self-calibration control means arranged:
  a) to generate a digital word with a chosen first value,
  b) then to estimate in-band noise IBN(n) from the filtered digital signals and to compare this in-band noise IBN(n) to the preceding in-band noise IBN(n−1),
  c) then to modify the value of the digital word in order to decrease the capacitance and/or the resistance of each integrator concerned from a chosen decrement when IBN(n) is smaller than IBN(n−1),
  d) then to iterate steps b) and c) till IBN(n) is equal to or greater than IBN(n−1), and to choose as a calibration digital word value the value corresponding to the preceding in-band noise IBN(n−1) in order to set the calibration state of the variable capacitance means and/or variable resistance means.

The converter (CT ΣΔ ADC) according to the invention may include additional characteristics considered separately or combined, and notably:

each variable capacitance means may comprise a chosen number of banks of capacitors, with a chosen capacitance, mounted in series with a two-state switch (S), and controlled by one bit value of the digital word;
  in step a) the self-calibration control means may be arranged to generate a digital word having a first value corresponding to a first capacitance equal to a chosen starting capacitance with a chosen increase step;
    the starting capacitance may correspond to a given spread of the integrator RC product;
    the chosen increase step may be equal to 33% of said starting capacitance, for instance;
    the decrement may be equal to a chosen proportion of the starting capacitance, depending on a process variation value, a temperature spread and a final targeted accuracy;
    the number of capacitors may be equal to 9, for instance. In this case, the nine capacitors offer together a maximum value equal to 4/3 of the starting capacitance, a first one of these nine capacitors having a value equal to 2/3 of the starting capacitance), each of the eight other capacitors having a value equal to 1/12 of the starting capacitance, and the decrement being equal to 1/12 of the starting capacitance;

each variable resistance means may comprise a chosen number of resistors, connected in series and having chosen respective resistances, and a same chosen number of two-state switches each controlled by one bit value of the digital word and respectively controlling the accesses to these resistors;
  in step a) the self-calibration control means may be arranged to generate a digital word having a first value corresponding to a first resistance equal to a chosen starting resistance with a chosen increase step;
    the starting resistance may correspond to a chosen spread of the integrator RC product;
    the chosen increase step may be equal to 33% of the starting resistance, for instance;
    the decrement may be equal to a chosen proportion of the starting resistance;
    the number of resistors may be equal to 9, for instance. In this case, the nine resistors offer together a maximum value equal to 4/3 of the starting resistance, a first one of these nine resistors having a value equal to 2/3 of the starting resistance, each of the eight other resistors having a value equal to 1/12 of the starting resistance, and the decrement being equal to 1/12 of the starting resistance;

it may be arranged to work in a differential mode. In this case, it may comprise two differential input nodes arranged to be fed with differential analog signals to be converted;
  the two differential input nodes may be shortcut during the calibration steps a) to d);

its signal path may comprise three, four or five (or else more than five) integrators mounted in series;

the CT ΣΔ ADC filter loop can be a single filter loop or a cascaded filter loop (also called MASH) built with cascading several CT ΣΔ ADC stages, each being either a first order CT ΣΔ ADC or a second order CT ΣΔ ADC;

it comprises high-frequency stabilization means (feedforward or feedback or a mixture of feedforward and feedback coefficient(s));

the DAC and the quantizer may be single bit or multi-bit ones.

The invention also provides an integrated circuit (IC), and possibly a baseband integrated circuit, comprising a converter such as the one introduced above. Such a (baseband) integrated circuit may be part of a receiver or transceiver device.

The invention also provides mobile radio communication equipment comprising a converter or a (baseband) integrated circuit or a receiving or transceiver device such as the ones introduced above.

BRIEF DESCRIPTION OF THE DRAWINGS

Other features and advantages of the invention will become apparent on examining the detailed specifications hereafter and the appended drawings, wherein.

The appended drawings may not only serve to complete the invention, but also to contribute to its definition, if need be.

DESCRIPTION OF PREFERRED EMBODIMENTS

Figure 1:
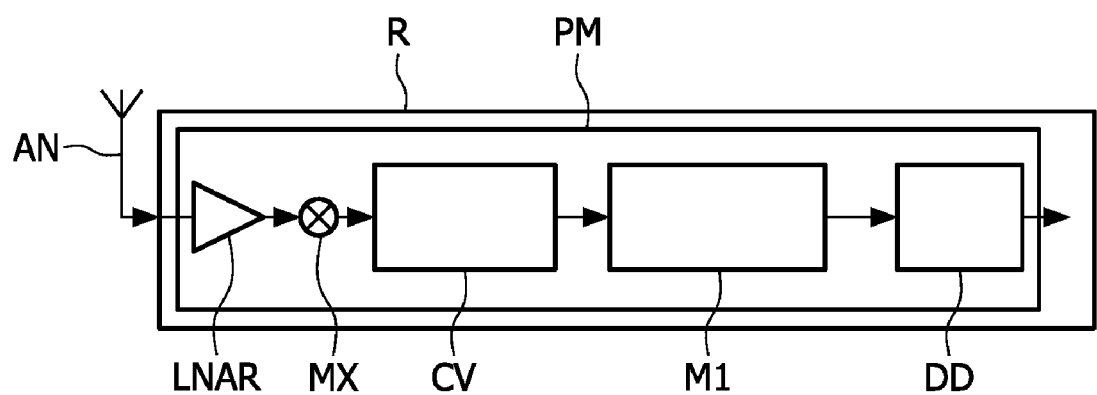
FIG. 1 schematically illustrates an example of a receiver device according to the invention, FIG. 2 schematically illustrates an example of embodiment of a 1-bit, single-loop, feedforward continuous-time sigma-delta analog-to-digital converter (CT ΣΔ ADC) according to the invention, FIG. 3 schematically illustrates an example of embodiment of the first integrator of the CT ΣΔ ADC illustrated in FIG. 2, in a differential working mode, FIG. 4 schematically illustrates an example of embodiment of the first integrator of the CT ΣΔ ADC illustrated in FIG. 2, in a single-ended working mode, FIG. 5 schematically illustrates an example of embodiment of the fifth (and last, if the CT ΣΔ ADC is a fifth order one) integrator of a 1-bit, single-loop, feedback CT ΣΔ ADC, variant of the CT ΣΔ ADC illustrated in FIG. 2, in a differential working mode, FIG. 6 schematically illustrates an example of embodiment of the fifth (and last, if the CT ΣΔ ADC is a fifth order one) integrator of a 1-bit, single-loop, feedback CT ΣΔ ADC, variant of the CT ΣΔ ADC illustrated in FIG. 2, in a single-ended working mode, FIG. 7 schematically illustrates an example of embodiment of a variable capacitance means for an integrator illustrated in FIG. 3, FIG. 8 schematically illustrates an example of embodiment of a variable resistance means for an integrator (except the first one H1) of a CT ΣΔ ADC according to the invention, FIG. 9 schematically illustrates an example of embodiment of a self-calibration control module of a CT ΣΔ ADC according to the invention, FIG. 10 schematically illustrates an example of evolution of the in-band noise (INB), in dB, as a function of the RC spread, in %, and the number of calibration iterations required when the starting capacitance (Ci) of the integrators is either equal to 0.8 Copt (where Copt is a nominal capacitance) or equal to 1.2 Copt, FIG. 11 schematically illustrates an example of capacitance calibration algorithm intended to be implemented by a self-calibration control module.

Reference is initially made to FIG. 1 to describe an example of receiver device R in which the invention may be applied. It is important to notice that the invention is not limited to receiver devices. Indeed it applies also to transceiver device, and more generally to any type of device adapted to receive analog radio signals to be converted into digital signals.

In the following description it will be considered that the receiver (or transceiver) device R is intended for mobile communication equipment such as a mobile phone, for instance a GSM or GPRS/EDGE or UMTS mobile phone, or Bluetooth or WLAN (Wireless Local Area Network) communication equipment. But it is important to notice that the invention is not limited to this type of radio communication equipment. For instance, it may also be used for television on mobile applications (DVB-H), and for all DVB standards (DVB-S, DVB-T or DVB-C, for instance). These examples of application are not exhaustive, and some other standards could also benefit from the invention.

As schematically illustrated in FIG. 1, a receiver (device) R according to the invention notably comprises an antenna AN adapted to receive analog modulated signals and a processing module PM fed with the received analog signals.

The processing module PM comprises a low noise amplifier LNA arranged to amplify the analog signals received by the antenna AN to feed a mixer MX which feeds a continuous-time sigma-delta analog-to-digital converter or CT $\Sigma\Delta$ ADC (hereafter named "converter") CV according to the invention, arranged to convert and filter the amplified analog signals into digital signals to feed a module Ml dedicated to channel filtering and noise-shaping digital filtering and feeding a digital demodulator DD arranged to demodulate the filtered digital signals.

Figure 2:
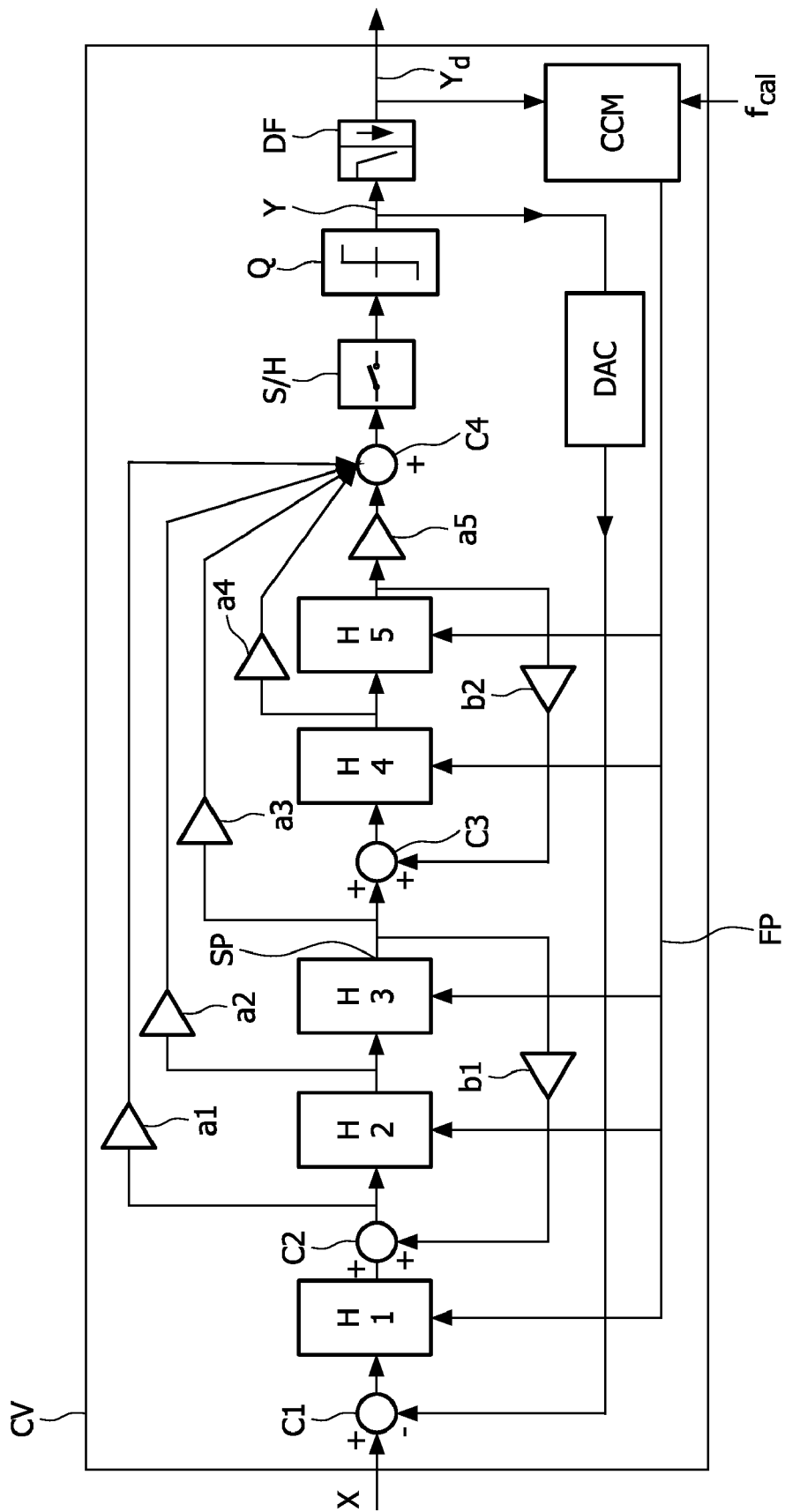

Reference is now made to FIG. 2 to describe an example of converter CV according to the invention.

As illustrated the converter CV comprises at least a signal path SP comprising at least one combiner C1 for combining the amplified analog signals to be converted with feedback analog signals, at least two integrators H1 and H2, mounted in series, for integrating the combined analog signals output by the combiner C1, a quantizer Q for converting the integrated signals output by the integrators H1 and H2 into digital signals Y, and a decimation filter DF for filtering the high-frequency quantization noise and reducing the bitstream data rate, and outputting filtered digital signals $Y_d$.

In the illustrated example of FIG. 2 the converter CV comprises five integrators H1-H5 mounted in series in the signal path SP to define a 5-th order filter. But the number of integrators (and then the order of the filter) is not limited to this example. It may be equal to any value greater than 2 to define at least a 2nd order filter in the signal path SP.

Each integrator Hj (j=1 to 5) is an active RC filter, such as an OTA-RC (Operational Transconductance Amplifier-RC), which achieves an excellent linearity performance.

The converter CV further comprises a feedback path FP comprising at least a digital-to-analog converter DAC arranged to convert the digital signals Y output by the quantizer Q into feedback analog signals intended for the combiner C1 (at least).

Although it is not illustrated in FIG. 2, the feedback path FP could be provided with at least one analog weighting means arranged to apply a chosen weighting coefficient to the feedback analog signals output by the DAC to convert them into weighted feedback analog signals intended for the combiner C1. In fact the feedback path FP may be provided with as many analog weighting means (applying different weighting coefficients) as integrators Hj (here j=1 to 5). The analog weighting means may be transconductances or voltage attenuators, for instance. They are used to stabilize the ADC loop. In this case the signal path SP must comprise one combiner before each integrator in order to feed the latter with combined received analog signals and weighted feedback analog signals. Each combiner is then arranged to subtract the weighted feedback analog signals it receives from the associated analog weighting means from the analog signals it receives either from the mixer MX or from the preceding integrator Hj−1.

To offer a high-frequency filtering the converter CV may have a feedback and/or feedforward topology.

A non mandatory 1-bit, single-loop, feedforward topology is illustrated in FIG. 2. More precisely in this example of embodiment the converter CV comprises two local resonator feedback means b1 and b2 mounted in parallel with the signal path SP. These local resonator feedback means may be transconductances or voltage attenuators, for instance. They are used to create notch(es) in the noise transfer function (NTF) to optimize the signal-to-quantization noise ratio (SQNR) in the bandwidth.

Each local resonator feedback means b1 or b2 is arranged to weight the integrated analog signals output by a chosen integrator H3 or H5 with a chosen coefficient to feed a combiner C2 or C4 with weighted analog signals, which combiner is located in the signal path SP before the integrator H2 or H4, itself located before this chosen integrator H3 or H5.

In this case each combiner (here C2 and C4) has an additional additive input to combine the integrated analog signals output by the preceding integrator (H1 or H3) with the weighted analog signals output by the local resonator feedback means b1 or b2 (and possibly with weighted feedback analog signals output by analog weighting means).

The converter CV may comprise only one local resonator feedback means (for instance b1 or b2) or more than two local resonator feedback means when the number of integrators Hj (or the filter order) is greater than or equal to 4.

In the non limiting example of embodiment illustrated in FIG. 2, the converter CV further comprises four weighted feedforward summation path a1-a4 mounted in parallel with the signal path SP, respectively between the output of the first H1, second H2, third H3 and fourth H4 integrators and the fourth combiner C4, and another weighted feedforward summation means a5 mounted in series in the signal path SP between the output of the fifth integrator H5 and the fourth combiner C4.

Each weighted feedforward summation path or means aj is arranged to weight, with a chosen coefficient, the integrated analog signals output by the preceding integrator (here Hj) to feed the fourth combiner C4 with weighted analog signals. For this purpose the fourth combiner C4 has as many additive inputs as weighted feedforward summation paths and means aj (here five) to feed the quantizer Q with the sum of all the weighted integrated analog signals output by the integrators H1-H5.

These weighted feedforward summation paths and means aj are also used to stabilize the ADC loop. Therefore, they may be mixed with the analog weighting means dj to maximize the advantages and minimize the drawbacks of the two topologies. But the cumulated number of weighted feedforward summation paths and means aj and analog weighting means must be equal to the filter order (L).

The invention proposes to integrate digital self-calibration means into the converter CV to allow calibration of the analog capacitors and/or resistors of at least one RC integrator Hj, to compensate process variations and temperature spread.

According to the invention at least one integrator Hj of the converter CV comprises variable capacitance means Cj and/or variable resistance means Rj. In the example illustrated in FIGS. 3 to 6 the integrators H1 and H5 (but this is also the case of integrators H2 to H4 of FIG. 2) only comprise a variable capacitance means Cj arranged to be set in chosen states depending on the values of a digital word. So a specific capacitance value of each variable capacitor means Cj of each integrator Hj corresponds to each digital word value.

Figure 11:
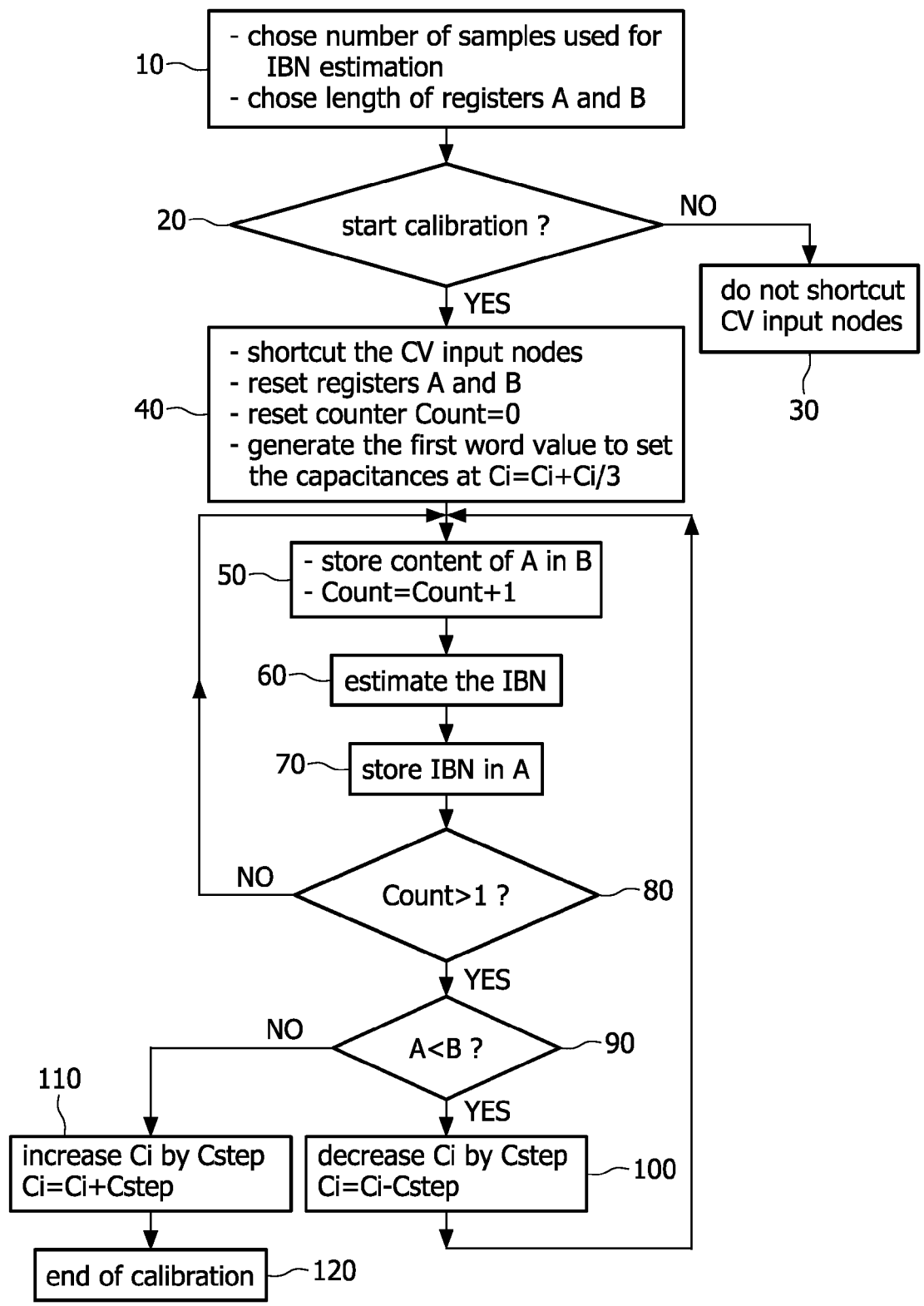

In practice all the capacitors are of the same type (for instance fringe or gate-oxyde capacitors), so the same correction is applied to each variable capacitor (as is described in the example of algorithm described below with reference to FIG. 11).

Figure 3:
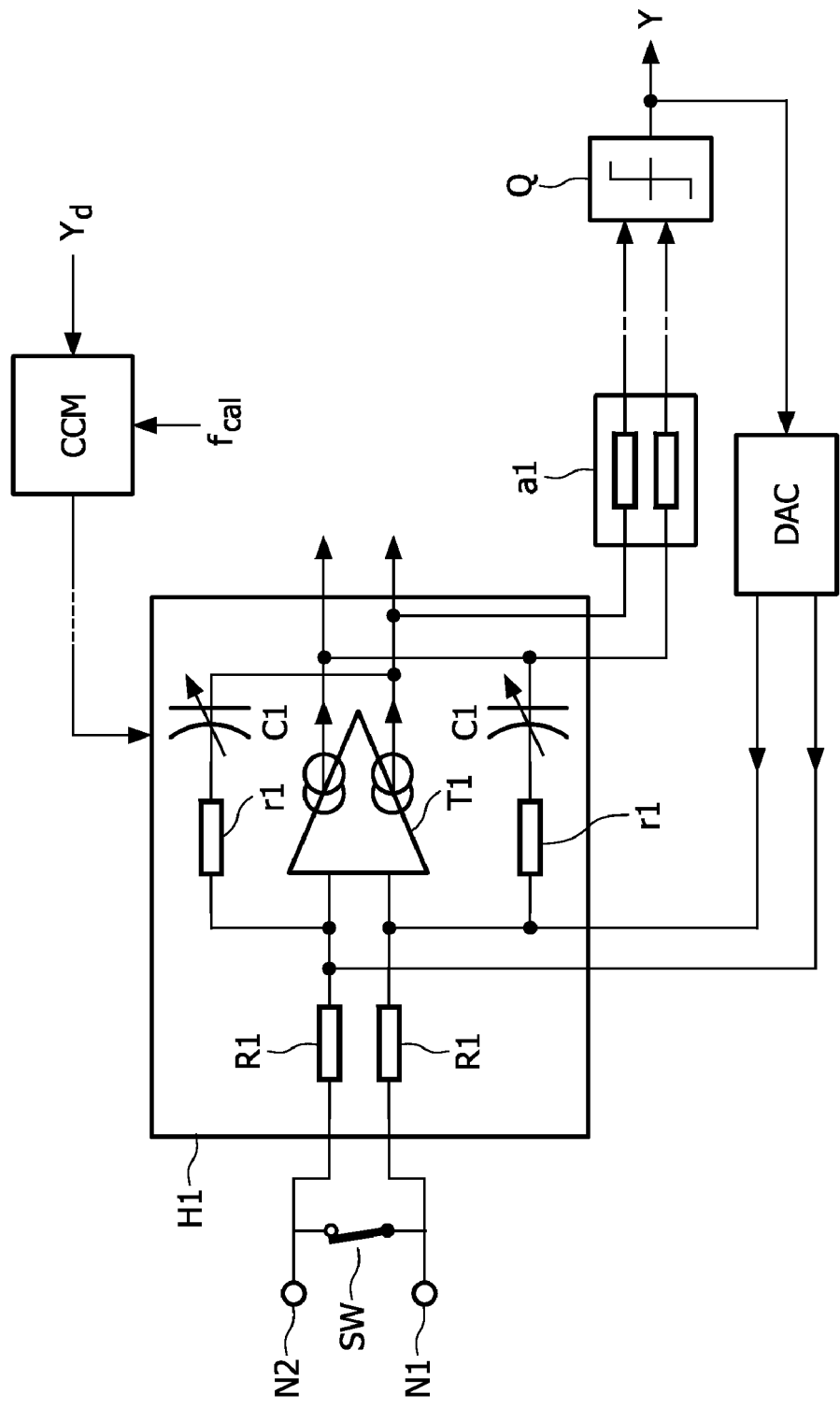

In FIG. 3, the feedforward coefficients Aj are implemented with resistors, but they could be also implemented with capacitors.

Figure 5:
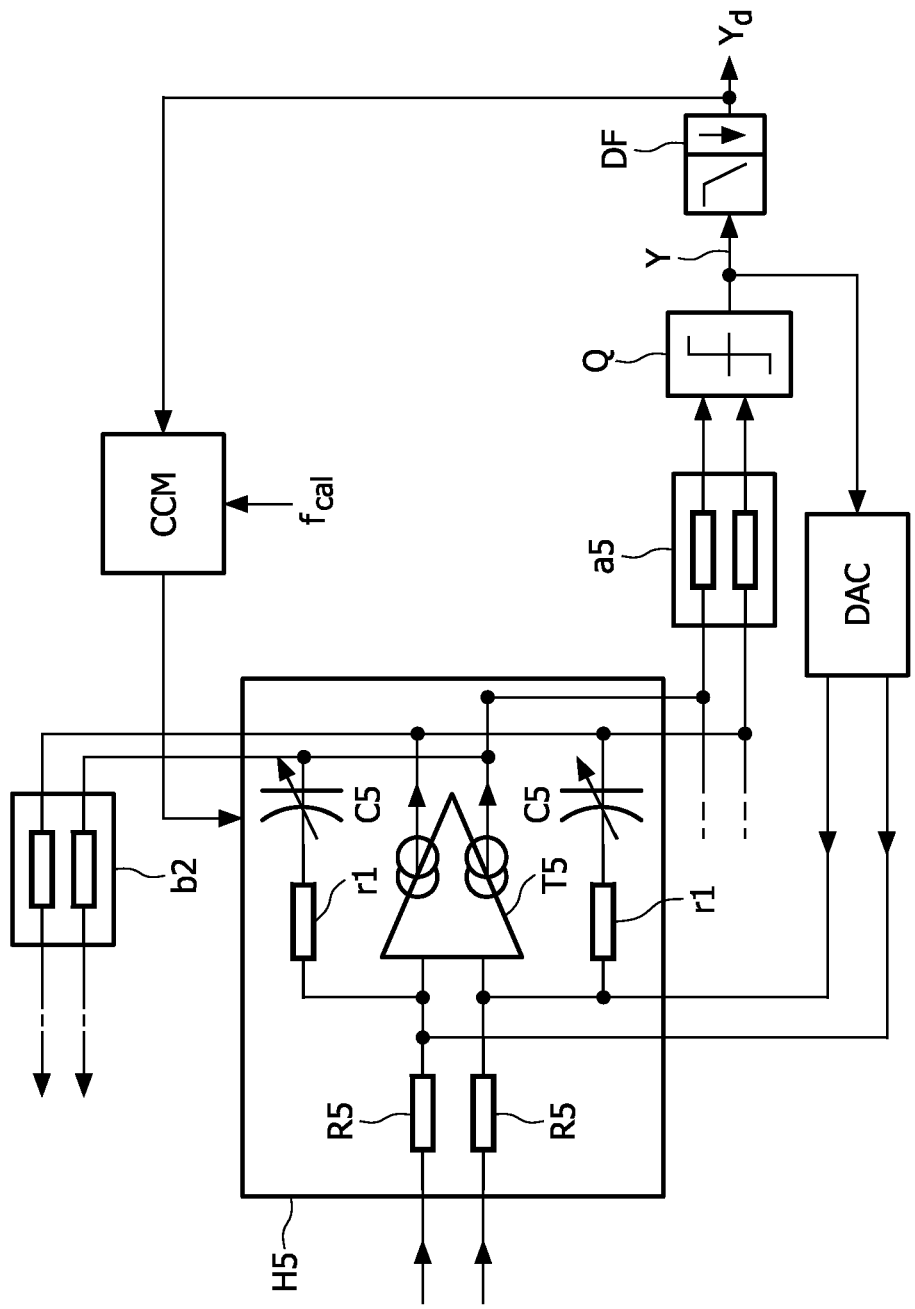

In FIGS. 3 and 5 the first H1 and last H5 integrators are illustrated in a differential working mode. So, each integrator Hj comprises a transconductance Tj with a differential input and a differential output.

Each differential input receives differential analog signals coming either from differential input nodes N1 and N2 of the converter CV (case of H1) or from a differential output of the preceding integrator Hj−1 (case of H2 to H5), through a resistor Rj (which can be variable and addressable by the digital word). A two-state control switch SW may be provided between the first N1 and second N2 differential input nodes.

Figure 4:
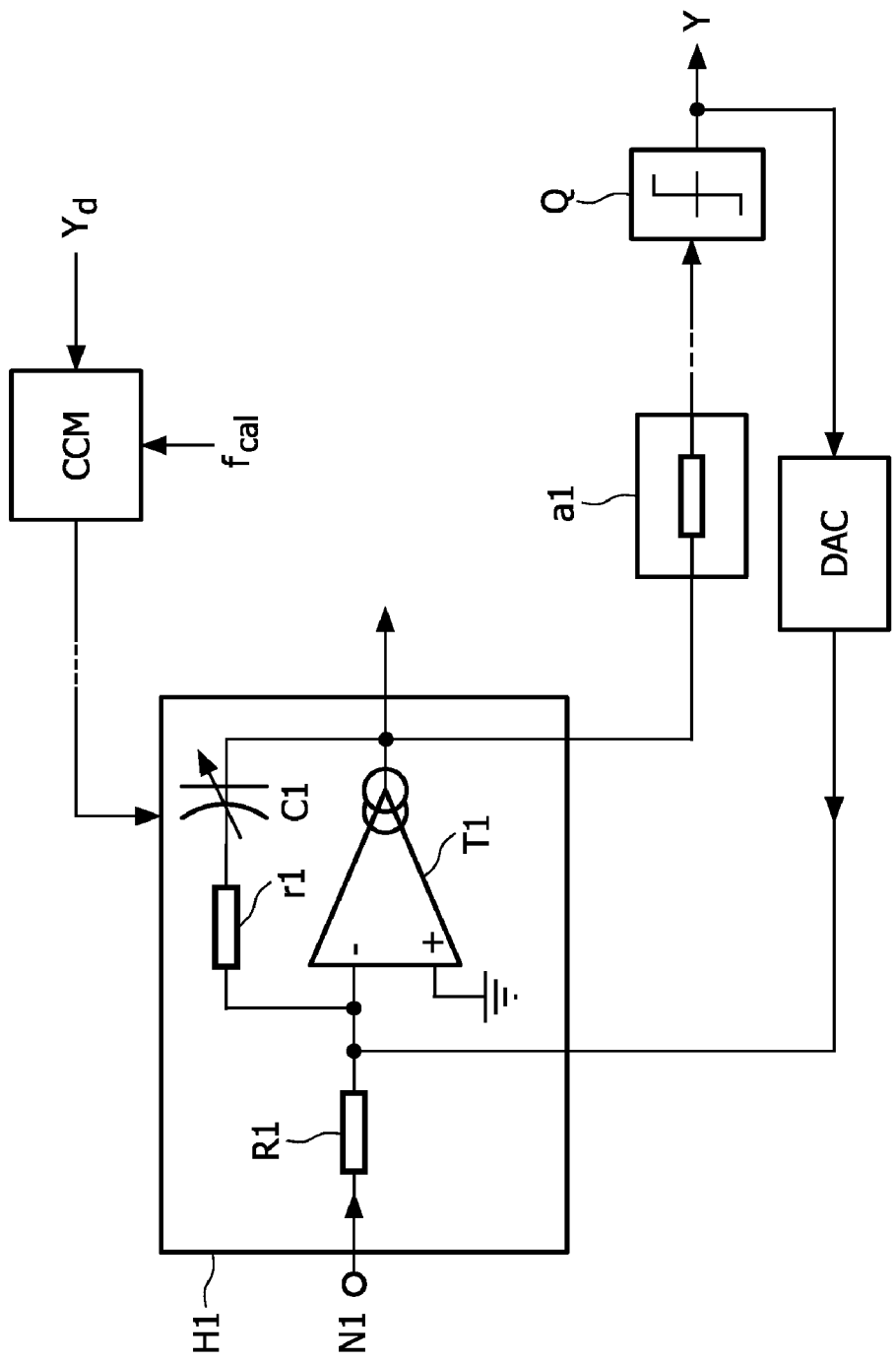
Figure 6:
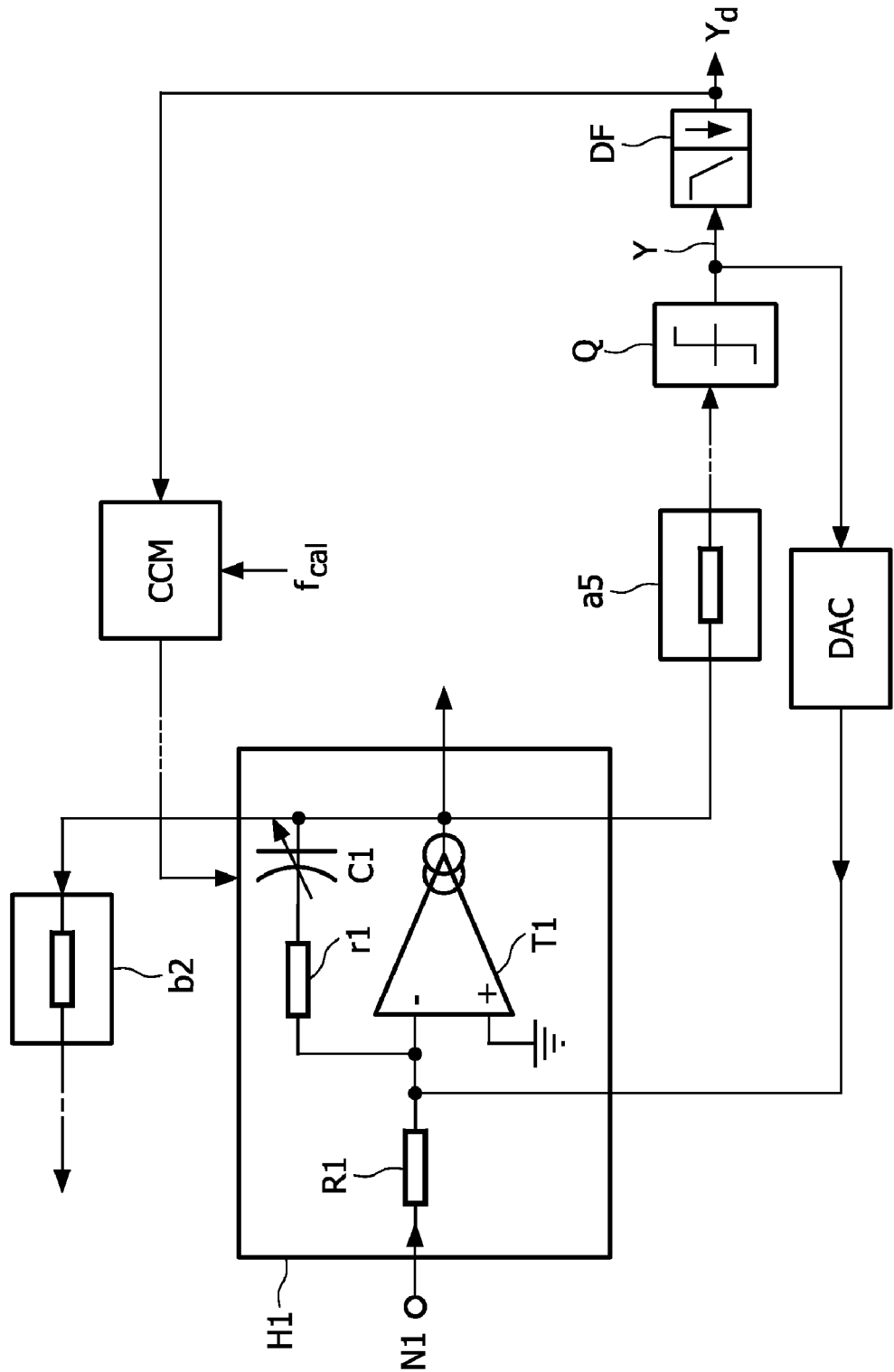

In FIGS. 4 and 6 the first H1 and last H5 integrators are illustrated in a single-ended working mode. So, each integrator Hj comprises a transconductance Tj with a single-ended input fed with analog signals and a single-ended output.

Figure 7:
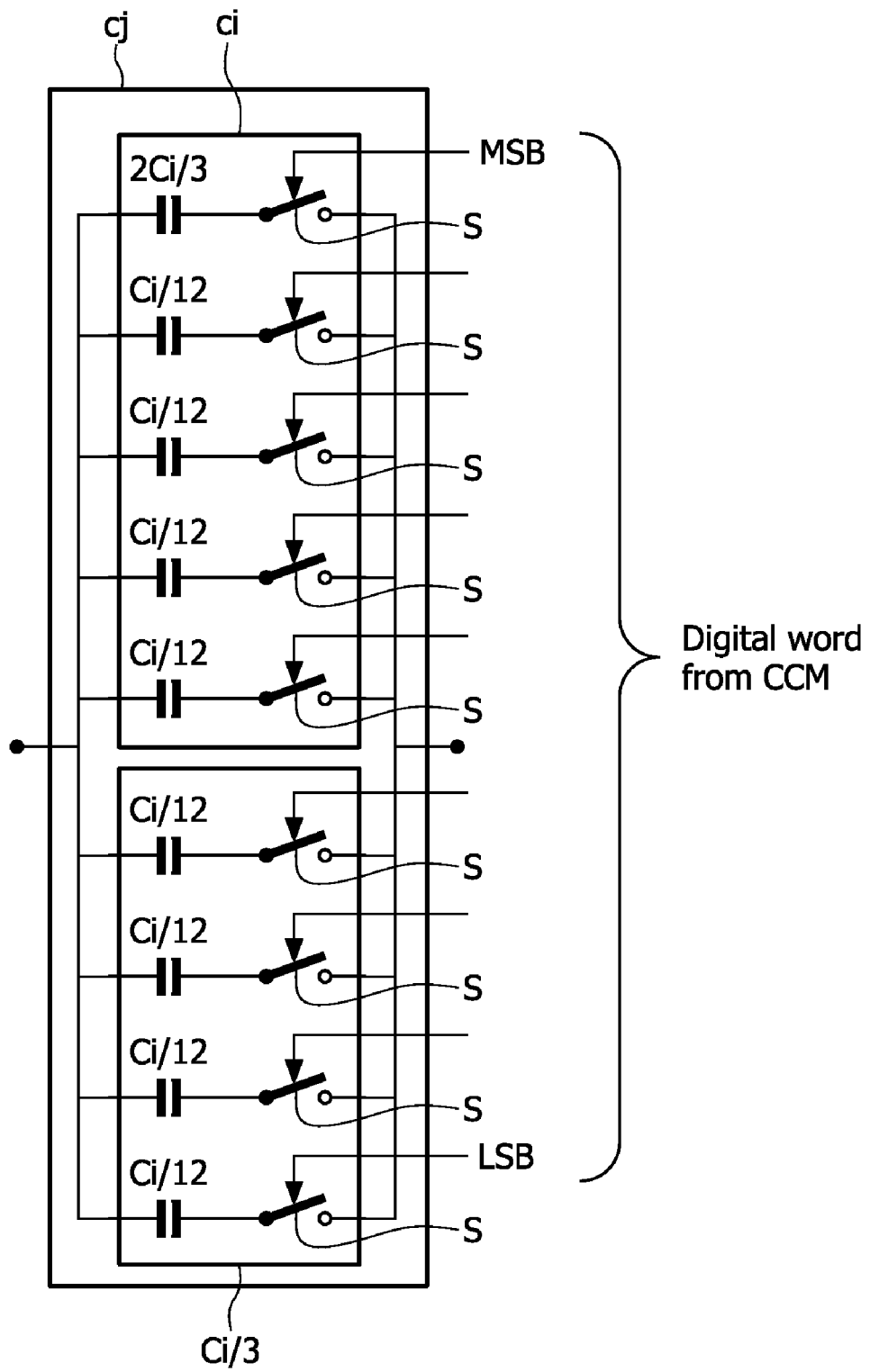

A non-limiting example of embodiment of a variable capacitance means Cj is illustrated in FIG. 7. In this example, the variable capacitance means Cj consists of 9 couples connected in parallel and each comprising a capacitor, with a chosen capacitance, and a two-state switch S mounted in series with the capacitor. Each two-state switch S is controlled by one bit value of the digital word generated by a self-calibration control module CCM which will be described below.

For instance, and as illustrated in FIG. 7, the number of couples may be equal to 9. In this case, the nine capacitors mounted in parallel offer together a maximum capacitance value equal to $4/3$ of a starting capacitance Ci ($4Ci/3$).

A first one of the nine capacitors has a value equal to $2/3$ of the starting capacitance Ci ($2Ci/3$), while each one of the eight other capacitors has a value equal to $1/12$ of the starting capacitance Ci ($Ci/12$), for instance.

As illustrated, the switch S connected to the first capacitor (with the capacitance value equal to $2Ci/3$) is preferably controlled by the digital word bit having the most significant weight (MSB), while the switch S connected to the last (or ninth) capacitor (with a capacitance value equal to $Ci/12$) is controlled by the digital word bit being the least significant bit (LSB).

With such an arrangement, it is possible to define first and second parts into a variable capacitance means Cj. The first part comprises the first to fifth couples and offers a maximum capacitance value equal to the starting capacitance Ci, while the second part comprises the sixth to ninth couples and offers a maximum capacitance value equal to $1/3$ of the starting capacitance Ci ($Ci/3$).

Moreover, this arrangement allows to vary the capacitance value of each variable capacitance means Cj by a decrement (or increment) equal to $1/12$ of the starting capacitance Ci ($Ci/12$).

Figure 8:
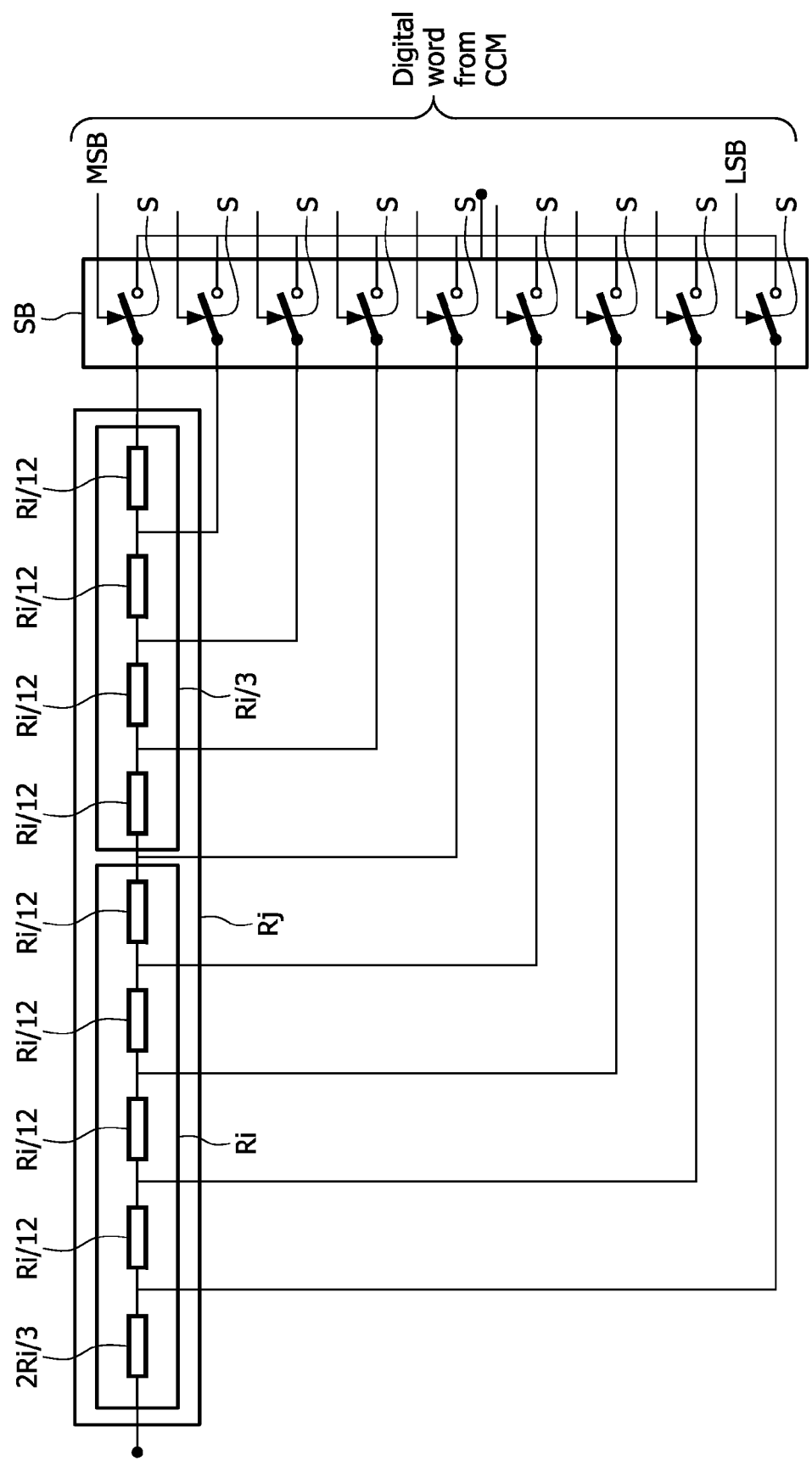

A non-limiting example of embodiment of a variable resistance means Rj (with j≠1 as will be explained below) is illustrated in FIG. 8. In this example, the variable resistance means Rj consists of nine resistors, connected in series and having chosen respective resistances, and nine two-state switches connected in parallel between the last resistor and two consecutive resistors, respectively.

Each two-state switch S is controlled by one bit value of the digital word generated by the self-calibration control module CCM.

For instance, and as illustrated in FIG. 7, the number of couples may be equal to 9. In this case, the nine resistors mounted in series offer together a maximum resistance value equal to $4/3$ of a starting resistance Ri ($4Ri/3$).

A first one of the nine resistors has a value equal to $2/3$ of the starting resistance Ri ($2Ri/3$), while each one of the eight other resistors has a value equal to $1/12$ of the starting resistance Ri ($Ri/12$), for instance.

As illustrated the switch S connected to the first resistor on the right side (to offer a cumulative resistance value equal to $4Ri/3$) is preferably controlled by the digital word bit being the most significant bit (MSB), while the switch S connected to the last (or ninth) resistor on the left (to offer a resistance value equal to $2Ri/3$) is controlled by the digital word bit being the least significant bit (LSB). With this arrangement, only one switch is "on" while all the others are off.

With such an arrangement, it is possible to define first and second parts into a variable resistance means Rj. The first part comprises the first to fifth resistors and offers a maximum resistance value equal to the starting resistance Ri, while the second part comprises the sixth to ninth resistors and offers a maximum resistance value equal to $1/3$ of the starting resistance Ri ($Ri/3$).

Moreover, this arrangement allows to vary the resistance value of each variable resistance means Rj (with j≠1) by a decrement (or increment) equal to $1/12$ of the starting resistance Ri ($Ri/12$).

In the differential working mode (FIGS. 3 and 5) the digital-to-analog converter DAC of the feedback path FP has one input connected to the signal path SP to be fed with digital signals Y and differential outputs connected to the differential inputs of the first integrator H1. Such a DAC may be a switched capacitor DAC, for instance.

In the single-ended working mode (FIGS. 4 and 6) the digital-to-analog converter DAC of the feedback path FP has one input connected to the signal path SP to be fed with digital signals Y and one output connected to the single-ended input of the first integrator H1.

Moreover, in the differential working mode each integrator Hj comprises two banks of variable capacitors Cj respectively connected in series with resistances rj (not variable—each resistance "rj" helps to stabilize the OTA-RC structure and has preferably a different value for each integrator Hj) into a differential feedback path. In the single-ended working mode each integrator Hj comprises one bank of variable capacitors Cj respectively connected in series with resistances rj in a single-ended feedback path.

Still in the differential working mode the optional weighted feedforward summation paths and means a1-a5, but also the optional local resonator feedback means b1 and b2, are differential.

As illustrated in FIGS. 2 to 6, the converter CV according to the invention also comprises a self-calibration control module CCM having an input connected to the signal path SP after the decimation filter DF, to be fed with filtered digital signals $Y_d$, and coupled to each variable capacitor means Cj and/or each variable resistor means Rj, to provide it (them) with a chosen digital word to control its (their) capacitance and/or resistance.

This self-calibration control module CCM is arranged to implement a calibration algorithm comprising the following four main steps.

In a first main step a) the self-calibration control module CCM generates a digital word with a chosen first value. This value corresponds to a chosen first capacitance value and/or first resistance value of each variable capacitor means Cj and/or each variable resistor means Rj (with j≠1, i.e. R2 to R5).

For instance, if the converter CV comprises integrators Hj such as the one illustrated in FIG. 3, the first value of the digital word corresponds to a first capacitance of each variable capacitor means Cj equal to a chosen starting capacitance Ci with a chosen increase step.

This starting capacitance Ci corresponds preferably to a chosen spread of the integrator RC product (or time constant). In analog integrated circuit (IC) design, the nominal value for a component (Ropt and Copt for instance) as well as the standard deviation from this nominal value due to process variations and temperature spread are well known inputs and are included in the modeling of the components. These inputs are used to set the starting capacitance Ci. In absence of any process variations and temperature spread Ci=Copt.

Figure 10:
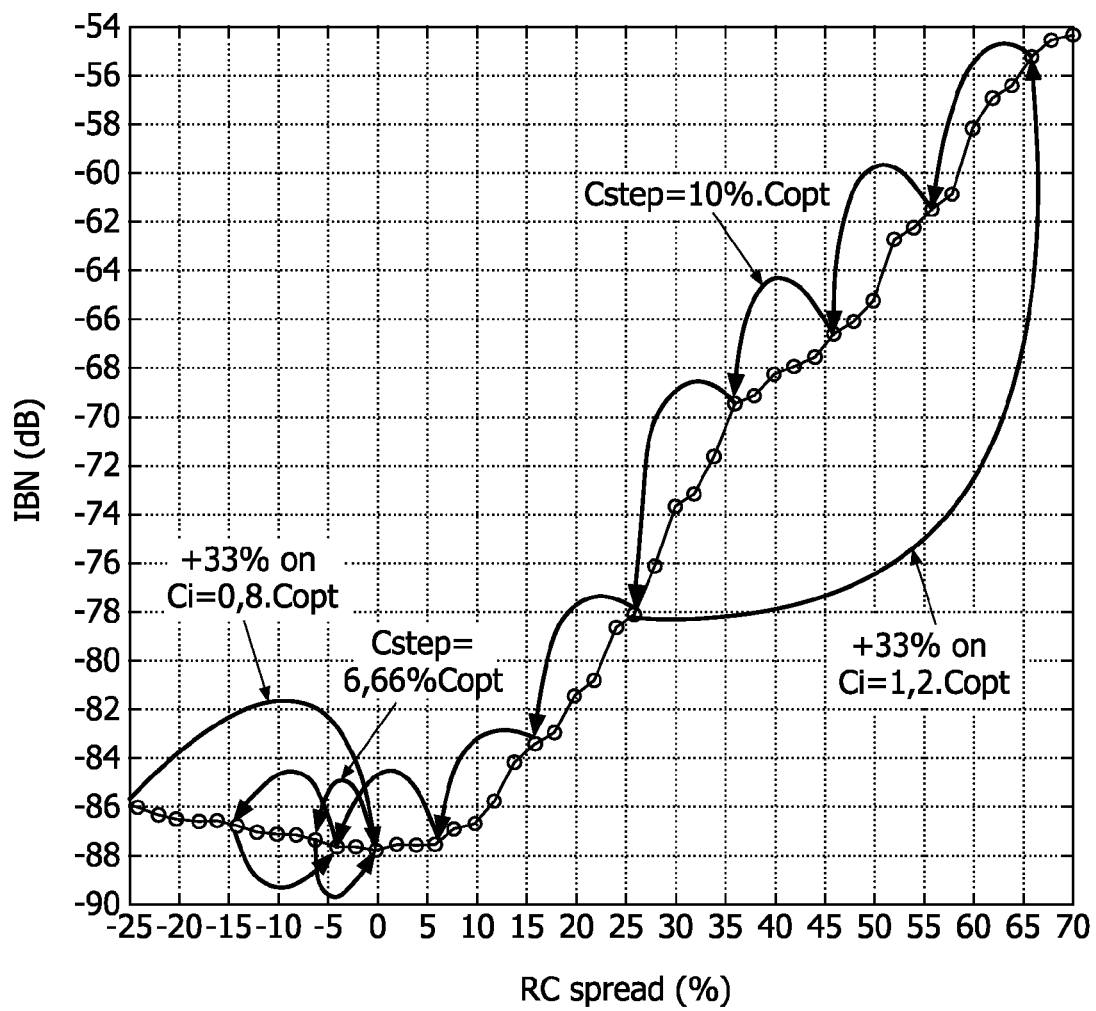

For instance and as illustrated in FIG. 10, in the example of the evolution of the in-band noise (IBN), in dB, as a function of the RC spread, the effective capacitance Ci can be Ci=0.8 Copt, which corresponds to a capacitance spread of −20%, or Ci=1.2 Copt, which corresponds to a C spread of +20%. However, the capacitance step must not only compensate for the capacitance variations but also for the resistance variations and temperature spread. The process variations and temperature spread depend on the technology (for instance they are different in CMOS 90 nm and CMOS 65 nm). Therefore, the Ci value must be chosen according to the CMOS technology used for the design.

The chosen increase step of the starting capacitance Ci may be equal to 33% (⅓) of this starting capacitance Ci, for instance +Ci/3. So, in this case the first value of the digital word corresponds to a first capacitance of each variable capacitance means Cj equal to 4Ci/3 (Ci+Ci/3). This example of chosen increase step (+33%) is well adapted to the examples of variable capacitance means Cj and variable resistance means Rj described above with reference to FIGS. 7 and 8. These examples of embodiment of variable capacitance means Cj and variable resistance means Rj illustrated in FIGS. 7 and 8 allow a capacitance coverage corresponding to a RC spread comprised in the range [−25%; +33%].

A +33% increase step simplifies the algorithm and the calibration time. In fact, one does not try to solve an optimization problem (i.e. to optimize the IBN) with the risk of having a local optimum, but one just minimizes the IBN. As such one does not have to search for a gradient as in the state of the art, because one always knows the direction to take: one always decreases the capacitance and/or the resistance.

Other values of the chosen increase step of the starting capacitance Ci may be selected, if another CMOS technology is used for design and/or if an accuracy better than +/−10% is required.

In a second main step b) the self-calibration control module CCM estimates in-band noise IBN(n) (with n=1) from the filtered digital signals $Y_d$ currently output by the decimation filter DF and corresponding to the new values of the variable capacitance means Cj and/or variable resistance means Rj, defined by the generated digital word.

As illustrated in FIG. 10, the IBN variations due to RC spread are not monotonic. The minimum of the IBN corresponds to the nominal RC value (no spread). Moreover, the absolute value of the IBN depends on the circuit noise. Since the circuit noise is temperature dependent, the absolute value of the IBN will vary depending on the die temperature during the calibration process. So, it is desirable to calibrate the RC product with a constant circuit noise.

If the calibration is achieved by triggering the resistance value Rj of each integrator Hj, the integrator noise will also change, because when optimizing the design for power consumption, resistor(s) R1 of the first integrator H1 is(are) usually the main noise contributor(s). So, it is not desirable to increase the resistance value of resistor(s) R1 and thus their thermal noise contribution because this would increase the total in-band noise (IBN) and reduce the signal-to-noise ratio (SNR). This situation happens as soon as the unity-gain frequencies of the integrators Hj are too high (i.e. when the RC product is smaller than the nominal one).

Therefore, it is preferable to calibrate the RC value by varying the capacitance value of the capacitors Cj of each integrator Hj. However, the loop filter topology being not sensitive to unity-gain variations of the first integrator H1, but very sensitive to the unity-gain frequency of the second to fifth integrators H2 to H5, a resistance calibration of the resistors Rj of each integrator Hj, except the first one H1, can be carried out. It is also possible to calibrate the capacitance value of the capacitors Cj of each integrator Hj and the resistance of the resistors Rj of each integrator Hj, except the first one H1.

For instance, the IBN is estimated by calculating the variance $P_Q$ of the filtered digital signals $Y_d$, defined by the following relation:

$$P_Q = \frac{1}{N_S} \sum_{n=0}^{N_S-1} |y_d(n)|^2 - \left| \frac{1}{N_S} \sum_{n=0}^{N_S-1} y_d(n) \right|^2$$

where $N_S$ is the number of samples used for estimation of IBN(n).

Figure 9:
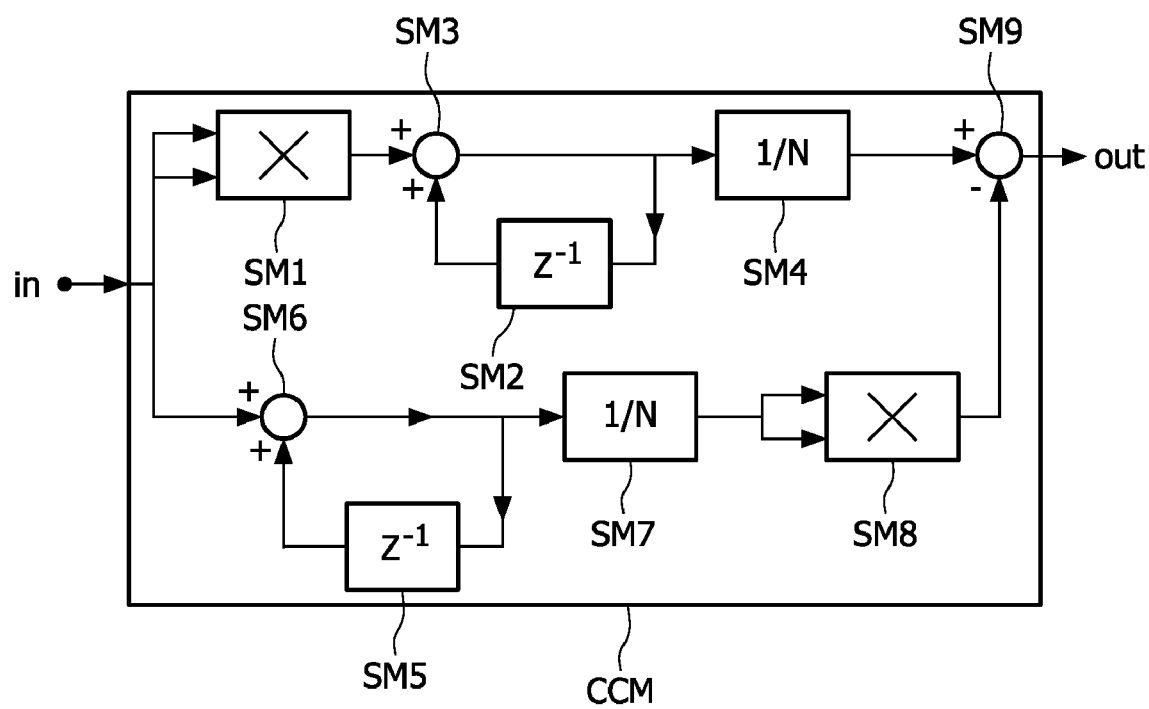

In order to implement such a variance computation, the self-calibration control module CCM may comprise an estimation module such as the one illustrated as an example in FIG. 9.

In this example of embodiment, the upper branch (sub-modules SM1-SM4) determines the first member of the right part of the relation ($P_Q$) cited above, the lower branch (sub-modules SM5-SM8) determines the second member of the right part of the relation cited above, and the combiner SM9 subtracts the value provided by the sub-modules SM5-SM8 of the second branch from the value provided by the sub-modules SM1-SM4 of the first branch.

When the in-band noise IBN(n) is estimated, the self-calibration control module CCM stores it in a register A and compares it to the preceding estimated in-band noise IBN(n−1), stored in a register B. When n=1, IBN(1) is the first estimate. So one can set arbitrarily IBN(n−1)=IBN(0) to 0.

Then in a third main step c) the self-calibration control module CCM modifies the value of the digital word generated last in order to decrease the current capacitance value Ci of each variable capacitance means Cj of each integrator Hj from a chosen decrement Cstep and/or the resistance value of each variable resistance means Rj of each integrator Hj except the first one H1, when IBN(n) is smaller than IBN(n−1).

This decrement Cstep (or Rstep) may be equal to a chosen proportion of the starting capacitance Ci (or starting resistance Rj). It depends on the final accuracy.

For instance, the decrement Cstep (or Rstep) may be equal to Ci/12 (or Ri/12) when a +/−10% accuracy on the RC spread must be achieved. It is worth noting that the IBN must be predicted with less accuracy, which fixes the number of samples $N_s$ required for the IBN estimation. This example of decrement is well adapted to the examples of variable capacitance means Cj and variable resistance means Rj described above with reference to FIGS. 7 and 8. These examples of embodiment of variable capacitance means Cj and variable resistance means Rj illustrated in FIGS. 7 and 8 allow to choose a decrement Cstep (or Rstep) situated in the range [Copt/15; Copt/10] (or [Ropt/15; Ropt/10]) when the accuracy is situated in the range [5%; 10%], for an initial capacitance (or resistance) increase step equal to 33%. So, the value of the decrement depends on the accuracy wanted.

Then in a fourth main step d) the self-calibration control module CCM iterates steps b) and c) till the currently estimated IBN(n) is equal to or greater than the previously estimated IBN(n−1). At most 9 iterations are necessary to converge to a final calibration value of the digital word. Thus the maximum calibration time $t_{cal}$, based on a number of samples $N_S=2^{16}$ at a frequency $f_S=288$ MHz, is given by the relation $t_{cal}=9*(N_S/f_S)\approx 2$ ms.

When IBN(n) is equal to or greater than IBN(n−1), the self-calibration control module CCM chooses as the final calibration value of the digital word the value that corresponds to IBN(n−1). Then it generates this final calibration value in order to set the calibration state of each variable capacitance means Cj and/or each variable resistance means Rj.

Two examples of calibration are illustrated in FIG. 10.

The first example corresponds to a RC spread of −25% (corresponding to Ci=0.8 Copt). The calibration starts with a 33% increase of the starting capacitance Ci, and follows with a first iteration corresponding to a decrease of the Ci value by a decrement Cstep=6.66% Copt, and ends by an increase of the Ci value by an increment Cstep=6.66% Copt. In this case the calibration time is approximately equal to 455 μs when $N_s=2^{16}$ and $f_s=288$ MHz.

The second example corresponds to a RC spread of +25% (corresponding to Ci=1.2 Copt). The calibration starts with a 33% increase of the starting capacitance Ci, and follows with eight iterations each corresponding to a decrease of the current Ci value by a decrement Cstep=10% Copt, and ends by an increase of the Ci value by an increment Cstep=10% Copt.

A more detailed example of calibration algorithm dedicated to variable capacitance means Cj will be described now with reference to FIG. 11.

In a preliminary starting step 10, one specifies in the self-calibration control module CCM the number $N_S$ of samples to be used for estimating the IBN, and the length of two registers A and B respectively intended for storing the current IBN estimate (IBN(n)) and the preceding IBN estimate (IBN(n−1)).

In a step 20, the self-calibration control module CCM carries out a test to determine whether a calibration must be started or not.

If there is no need to start the calibration, then the calibration algorithm ends in a step 30 in which the self-calibration control module CCM may decide not to shortcut the differential input nodes N1 and N2 of the converter CV, for instance.

If the calibration must be started, then in a step 40, the self-calibration control module CCM may start by shortcutting the differential input nodes N1 and N2 of the converter CV by means of the control switch SW illustrated in FIG. 3. This shortcutting operation is not mandatory because converter CV is self-biased due to the feedback mechanism. But this is preferable in order to avoid any distortion effect that could corrupt the IBN estimation.

Then the self-calibration control module CCM resets the value of registers A and B and the value of a counter (Count=0), and generates a digital word with a chosen first value. For instance, this first value corresponds to a 33% increase of the starting capacitance Ci of each variable capacitance means Cj of each integrator Hj. So, the first value of the digital word sets the capacitance value of each variable capacitance means Cj to 4Ci/3 (Ci+Ci/3).

In a step 50, the self-calibration control module CCM stores the value of register A in register B, and increments the value of the counter by 1 (Count=Count+1).

In a step 60, the self-calibration control module CCM estimates the in-band noise IBN(n) (here n=1) from the filtered digital signals $Y_d$.

In a step 70, the self-calibration control module CCM stores the estimated IBN value (IBN(1)) in register A.

In a step 80, the self-calibration control module CCM carries out a test to determine if the value of the counter is greater than 1 (Count>1).

If this counter value is smaller than 1 (Count<1), then the self-calibration control module CCM comes back to step 50.

If the counter value is greater than 1 (Count>1), then the self-calibration control module CCM carries out another test in a step 90 to determine whether the value stored in register A is smaller than the value stored in register B.

If the A value is smaller than the B value (A<B, i.e. IBN(n)<IBN(n−1)), this means that the final calibration value has not been found yet. Then the self-calibration control module CCM carries out a step 100 in which it modifies the value of the digital word generated last in order to decrease the current capacitance value Ci of each variable capacitance means Cj of each integrator Hj from a chosen decrement Cstep. So each new capacitance value Ci becomes equal to Ci−Cstep (Ci=Ci−Cstep). Then the self-calibration control module CCM comes back to step 50 for a new iteration.

If the A value is greater than the B value (A>B, i.e. IBN(n)>IBN(n−1)), this means that the calibration value has just been passed. Then the self-calibration control module CCM carries out a step 110 in which it chooses the value that corresponds to IBN(n−1), stored in register B, as the final calibration value of the digital word. So it generates this final calibration value in order to set the calibration state of each variable capacitor means Cj. And the calibration algorithm ends in a final step 120.

It is important to notice that the digital-to-analog converter DAC and the quantizer Q illustrated in FIGS. 2-6 are of the single bit type. But the invention also applies to digital-to-analog converter DAC and quantizer Q of the multi-bit type.

Preferably, the converter CV is an integrated circuit IC, and possibly a baseband integrated circuit. Such an integrated circuit may be realized in CMOS technology or in any technology currently used in chip manufacture, and notably in AsGa or BiCMOS technology.

A converter CV according to the invention offers several advantages, and notably:
  it does not require any specific input pattern dedicated to calibration,
  it can be used to calibrate process and/or temperature variations,
  because of its very fast convergence (at most 9 iterations), it allows calibration each time it needs to be used (for instance at each burst or at each time-slot),
  it can be arranged according to any topology, and not only to the feedforward topology.

The invention is not limited to the embodiments of continuous-time sigma-delta analog-to-digital converter, (baseband) integrated circuit, receiver device, transceiver device and radio communication equipment described above only by way of example, but it includes all alternative embodiments which may be considered by one skilled in the art to be within the scope of the claims hereafter.

The invention claimed is:

1. A continuous-time sigma-delta analog-to-digital converter for converting analog signals into digital signals, comprising i) a signal path comprising at least one combiner adapted to combine analog signals to be converted with feedback analog signals, at least two integrators mounted in series and adapted to integrate said combined analog signals, a quantizer adapted to convert said integrated signals into digital signals, a decimation filter for filtering digital signals, and ii) a feedback path comprising at least a digital-to-analog converter (DAC) adapted to convert said digital signals output by said quantizer into feedback analog signals intended for said combiner, characterized in that at least one of said integrators comprises variable capacitance means and/or variable resistance means arranged to be set in chosen states depending on values of a digital word to present chosen capacitances and/or chosen resistances, and in that it also comprises a self-calibration control means arranged a) to generate a digital word with a chosen first value, b) then to estimate in-band noise IBN from said filtered digital signals and to compare said in-band noise IBN) to the preceding in-band noise IBN, c) then to modify the value of the digital word in order to decrease said capacitance and/or resistance of each concerned integrator from a chosen decrement, when BN is smaller than IBN, d) then to iterate steps b) and c) till IBN is equal to or greater than IBN, and to choose as calibration digital word value the value corresponding to the preceding in-band noise IBN in order to set said calibration state.

2. The converter according to claim 1, characterized in that each variable capacitance means comprises a chosen number of banks of capacitors, with a chosen capacitance, mounted in series with a two-state switch, controlled by one bit value of said digital word.

3. The converter according to claim 2, characterized in that in step a) said self-calibration control means is arranged to generate a digital word having a first value corresponding to a first capacitance equal to a chosen starting capacitance with a chosen increase step.

4. The converter according to claim 1, characterized in that said starting capacitance corresponds to a given spread of the integrator RC product.

5. The converter according to claim 1, characterized in that said chosen increase step is equal to 33% of said starting capacitance.

6. The converter according to claim 1, characterized in that said decrement) is equal to a chosen proportion of said starting capacitance, depending on a process variation value, a temperature spread and a final targeted accuracy.

7. The converter according to claim 1, characterized in that said number of capacitors is equal to 9, said nine capacitors offer together a maximum value equal to $4/3$ of said starting capacitance, a first one of said nine capacitors having a value equal to $2/3$ of said starting capacitance, each of the eight other capacitors having a value equal to $1/12$ of said starting capacitance, and said decrement being equal to $1/12$ of said starting capacitance.

8. The converter according to claim 1, characterized in that each variable resistance means comprises a chosen number of resistors, connected in series and having chosen respective resistances, and a same chosen number of two-state switches, each controlled by one bit value of said digital word and respectively controlling the accesses to said resistors.

9. The converter according to claim 8, characterized in that in step a) said self-calibration control means is arranged to generate a digital word having a first value corresponding to a first resistance equal to a chosen starting resistance with a chosen increase step.

10. The converter according to claim 9, characterized in that said starting resistance corresponds to a chosen spread of the integrator RC product.

11. The converter according to claim 1, characterized in that said chosen increase step is equal to 33% of said starting resistance.

12. The converter according to claim 1, characterized in that said decrement is equal to a chosen proportion of said starting resistance.

13. The converter according to claim 1, characterized in that said number of resistors is equal to 9, said nine resistors together offering a maximum value equal to $4/3$ of said starting resistance, one of said nine resistors having a value equal to $2/3$ of said starting resistance, each of the eight other resistors having a value equal to $1/12$ of said starting resistance, and said decrement being equal to $1/12$ of said starting resistance.

14. The converter according to claim 1, characterized in that it is arranged to work in a differential mode and comprises two differential input nodes arranged to be fed with differential analog signals to be converted.

15. The converter according to claim 14, characterized in that said two differential input nodes are shortcut during said calibration steps a) to d).

16. The converter according to claim 1, characterized in that said signal path comprises five different integrators mounted in series.

17. The converter according to claim 1, characterized in that said digital-to-analog converter and said quantizer are of the single-bit or multi-bit type.

18. The converter according to claim 1, characterized in that it is built with one filter loop.

19. The converter according to claim 1, characterized in that it is built by cascading several CT ΣΔ ADC stages, each being either a first-order CT ΣΔ ADC or a second-order CT ΣΔ ADC.

20. The converter according to claim 1, characterized in that it comprises high-frequency stabilization means.

21. An integrated circuit, characterized in that it comprises a converter according to claim 1.

22. The integrated circuit according to claim 21, characterized in that it defines a baseband integrated circuit.

23. A receiving device, characterized in that it comprises an integrated circuit according to claim 21.

24. A transceiver device, characterized in that it comprises a converter according to claim 1.

25. A mobile radio communication equipment, characterized in that it comprises a converter or an integrated circuit or a receiving device or a transceiver device according to claim 21.

* * * * *